(12) United States Patent
Njinda et al.

(10) Patent No.: US 7,240,255 B2
(45) Date of Patent: Jul. 3, 2007

(54) AREA EFFICIENT BIST SYSTEM FOR MEMORIES

(75) Inventors: Charles Akum Njinda, San Jose, CA (US); Shalesh Thusoo, Milpitas, CA (US); Hao Wang, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 294 days.

(21) Appl. No.: 11/088,636

(22) Filed: Mar. 22, 2005

(65) Prior Publication Data

US 2006/0218452 A1    Sep. 28, 2006

(51) Int. Cl.
*G11C 29/00* (2006.01)
(52) U.S. Cl. .................................. 714/718; 714/733
(58) Field of Classification Search .................. 716/4; 714/39, 727, 718, 733
See application file for complete search history.

(56) References Cited

U.S. PATENT DOCUMENTS

| | | | | |
|---|---|---|---|---|
| 5,995,731 | A | * | 11/1999 | Crouch et al. .................. 716/4 |
| 6,321,320 | B1 | * | 11/2001 | Fleischman et al. ........ 711/217 |
| 6,374,370 | B1 | * | 4/2002 | Bockhaus et al. ............ 714/39 |
| 6,408,413 | B1 | * | 6/2002 | Whetsel ....................... 714/727 |
| 6,609,222 | B1 | * | 8/2003 | Gupta et al. ................. 714/733 |
| 6,728,916 | B2 | * | 4/2004 | Chen et al. .................. 714/733 |

OTHER PUBLICATIONS

Charles A. Njinda; A Hierarchical DFT Architecture for Chip, Board and System Test/Debug; Procket Networks.

A.J. Van de Goor et al.; March LR: A Test for Realistic Linked Faults;—14th VLSI Test Symposium; 1996; pp. 272-280.

Jay Jahangiri; Reducued Pin-Count Test; Mentor Graphics—Test & Measurement World; Mar. 1, 2005; pp. 1-7.

Theo J. Powell et al.; BIST for Deep Submicron ASIC Memories with High Perfromance Application; ITC International Test Conference; 2003; pp. 386-392.

Metnor Graphics Corporation; Memory Built-In Self-Test; Mentor Graphics; 2004.

Rob Aitken; Embedded Memory Test Patterns at 130nm and Below; Artisan Components; 2004; pp. 1-31.

* cited by examiner

*Primary Examiner*—David Ton
(74) *Attorney, Agent, or Firm*—Marger Johnson & McCollom, P.C.

(57) ABSTRACT

A system with a single BIST for an IC that includes a number of memory arrays that may have varying latencies, widths, and depths. A serial bus (which may be a debug bus) connects the BIST controller, each of the memory arrays on the IC, and a controller. Each memory array has an associated Design for Test Assist Logic (DAL) block. The DAL associated with any particular memory array recognizes commands from the BIST that are for the associated memory array, controls the execution of write/read commands for the associated array and sends data read from the memory array along with appropriate commands to the comparator after a latency that is appropriate for the associated array Thus, there are standardized commands from the BIST, but each DAL executes these commands in a manner appropriate for the memory array (or arrays) associated with the particular DAL.

21 Claims, 6 Drawing Sheets

Figure 3 (Example of an FP Block)
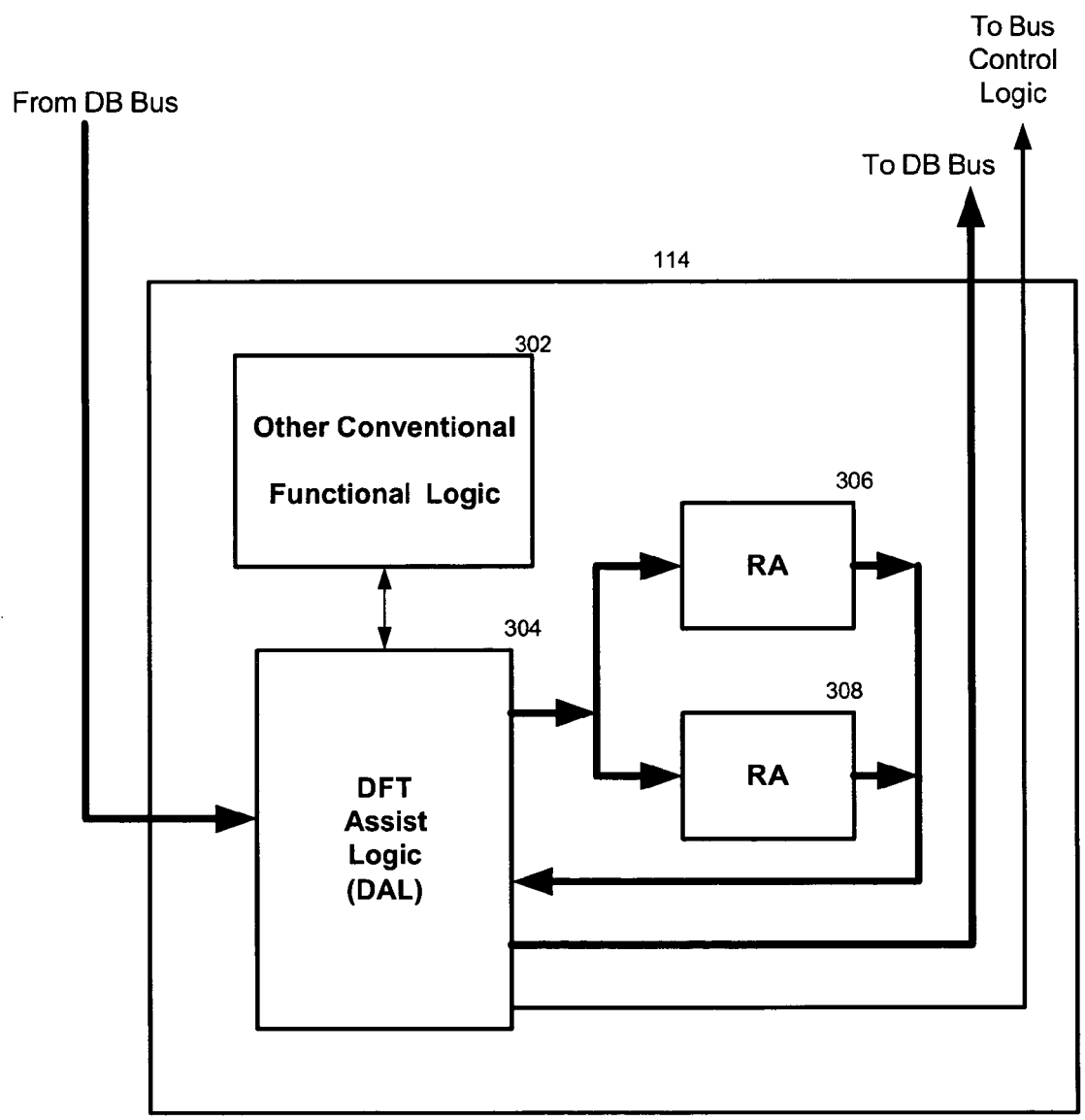

AREA EFFICIENT BIST SYSTEM FOR MEMORIES

FIELD OF THE INVENTION

The present invention relates to semiconductor integrated circuits and more particularly to test circuitry for integrated circuit memories.

BACKGROUND OF THE INVENTION

It is practically impossible to eliminating all of the potential defects that can occur when manufacturing a semiconductor integrated circuit (IC). Thus each IC that is manufactured must be tested in order to insure that no defective parts are shipped to customers.

A common methodology used when defining ICs is termed Design For Test (DFT). DFT forces the circuit designer to design the semiconductor circuitry in such a manner that the circuitry can be effectively tested.

Frequently circuit designers provide special or additional circuitry on an IC for performing Built in Self Tests (BIST). For example, BIST circuitry can be added to a memory array in order to apply standard memory test algorithms to the memory array in order to detect defects. Various algorithms have been developed to effectively and efficiently test memory arrays. A memory BIST applies memory test algorithms to a memory in order to detect defects within memory arrays and in the associated logical circuitry.

In general a memory BIST circuit uses various test algorithms to determine if data can be written to and read from memory cells correctly. In such tests, test data having a predetermined bit pattern is written in memory cells, then read from the memory cells. A comparison is then performed to determined whether the data read from the cells matched the expected data. If the readout data matches the expected data, the semiconductor memory device is considered to be operating properly. On the other hand, when the data read from the memory does not match the expected data, it is an indication that the memory device is defective.

In some of today's large ICs there can be dozens or even hundreds of small memory blocks distributed throughout the circuitry on the IC. Different memories on a single IC many have different latencies. That is, the time period required for data stored in the memory to appear on an output bus during a read cycle may be different for different memory arrays that are on a single IC. A memory BIST must be designed to check the value of the output data at a time that is appropriate for the particular memory being tested.

Where an IC has many memories, one approach that has been used is to provide a separate BIST for each memory on the IC. This requires a relatively large amount of circuitry. A second approach that has been used is to provide a single BIST for a group of memory arrays on an IC which have the same latency. In such an approach the physical location and various timing considerations limit how many arrays can share the same BIST logic. This second approach requires less circuitry than the first approach, but it still can require a large amount of circuitry.

SUMMARY OF THE PRESENT INVENTION

The present invention provides a system with a single BIST for an IC that includes a number of memory arrays that may have varying latencies, widths, and depths. With the present invention, a serial bus (which may be a debug bus) connects the BIST controller, each of the memory arrays on the IC, and a BIST comparator. Each memory array has an associated Design-for-Test-Assist Logic (DAL) block. The DAL associated with any particular memory array recognizes commands from the BIST that are for the associated memory array, controls the execution of write/read commands for the associated array and sends data read from the memory array along with appropriate commands to the comparator after a latency that is appropriate for the associated array. Thus, there are common or standardized commands from the BIST, but each DAL executes these commands in a manner appropriate for the memory array (or arrays) associated with the particular DAL.

BRIEF DESCRIPTION OF THE FIGURES

FIG. 3 is a block diagram of a exemplary floor plan block.

DETAILED DESCRIPTION

Figure 1:
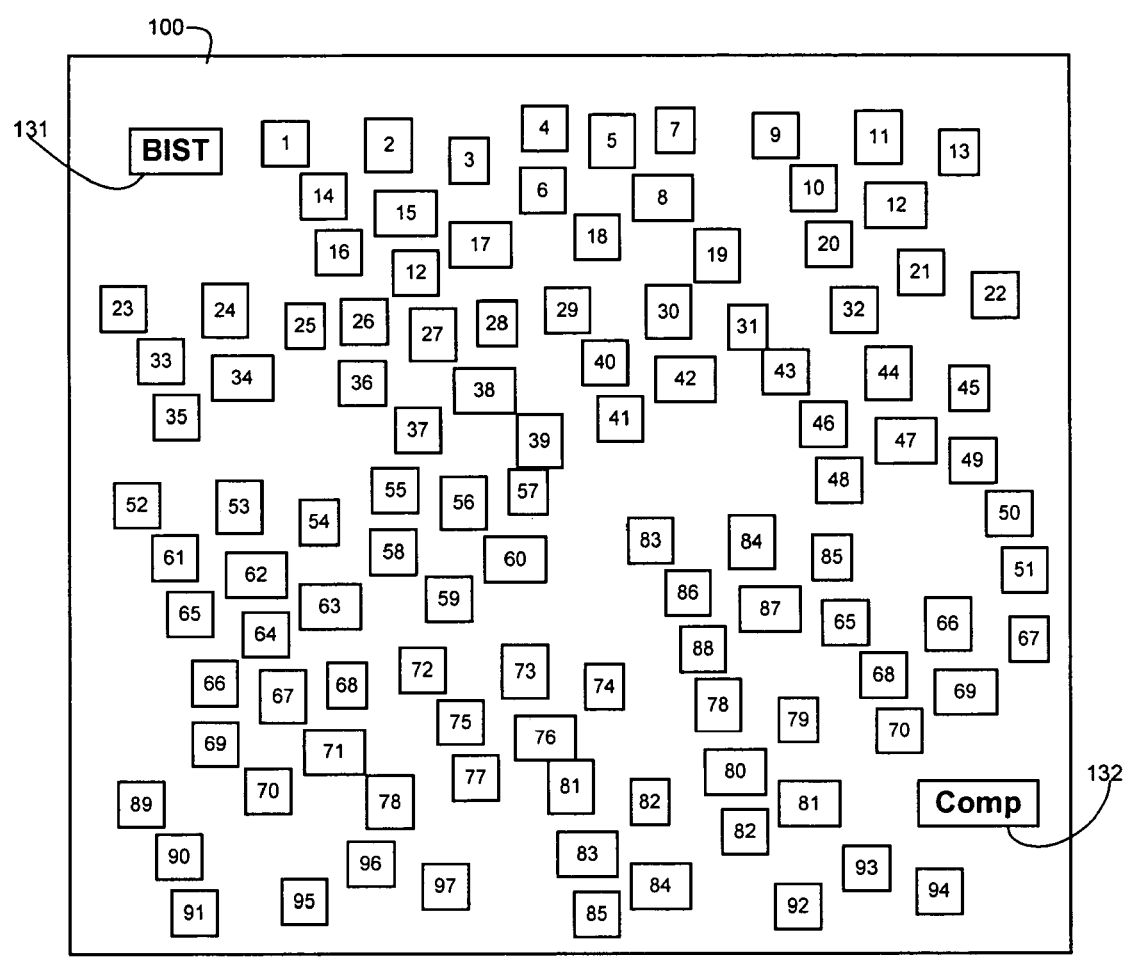
FIG. 1 is a floor plan diagram of an integrated circuit chip that includes an embodiment of the present invention.

Several preferred embodiments of the present invention are described and discussed below with reference to the drawings listed above. The drawings illustrate exemplary preferred embodiments of the invention and the operation of such embodiments. It should, however, be noted that this invention may be embodied in many different forms and the invention should not be construed as being limited to the embodiments set forth herein.

The following description conveys, in full, clear, and concise terms, to one skilled in the art, how to make and use the invention. In the drawings, the size of the boxes is not intended to represent the size of the various physical components. The same reference numerals are used to denote the same elements throughout the drawings.

Only the parts of the various units that are relevant to an explanation of the present invention are shown and described herein. It should be understood that the units shown the drawings and described herein have other conventional parts and operations, in addition to those shown and described herein. Such conventional parts and operations are known to those skilled in the art.

The present invention is directed to a system for testing memory arrays on a integrated circuit chip. FIG. 1 illustrates the floor plan, i.e., the layout, of an exemplary integrated circuit chip 100. The chip 100 includes many different blocks of circuits designated by the number 1 to 97. Many of the blocks 1 to 97 include one or more memory arrays. The purpose of the present invention is to test the memory arrays in these blocks. Two blocks of particular significance are the BIST block indicated by the number 131 and the comparator block indicated by the number 132. These blocks will be described in detail later.

While for convenience of illustration only ninety-seven blocks are illustrated, modern day integrated circuits may include thousands of such circuit blocks in their floor plan.

With respect to the present invention the actual number of blocks is not relevant. Different embodiments will include different numbers of circuit blocks in their floor plan.

Each of the circuit blocks shown in FIG. 1 is connected by a debug bus (designated a DB bus) as is conventional. The DB bus includes, address lines, data lines and control lines as is conventional. For convenience of illustration the bus is not shown in FIG. 1; however, it is shown in FIG. 2.

Figure 2A:
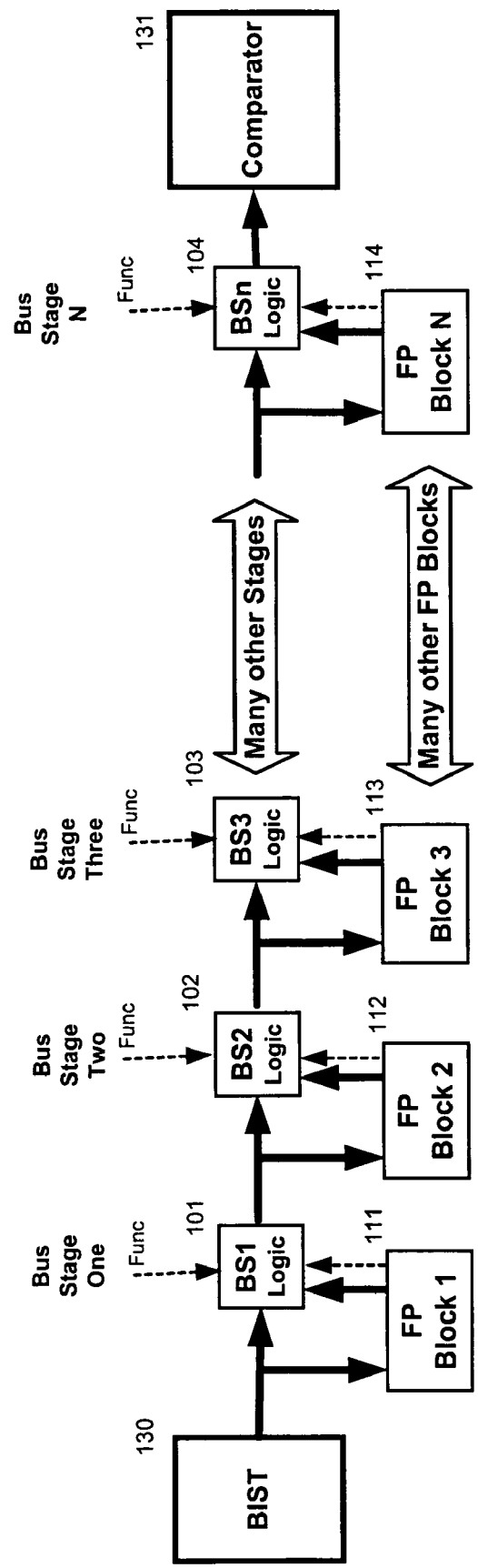
FIG. 2A is an overall system block diagram.

FIG. 2A shows the DB bus that connects the various floor plan blocks. The DB bus consists of a series of connected stages, one stage of the bus being associated with each floor plan block. FIG. 2A shows a number of floor plan blocks and the associated stages in the DB bus. Specifically FIG. 2A shows four floor plan blocks designated 1, 2, 3 and n and the associated DB bus stages designated BS1, BS2, BS3 and BSn. The dark lines in FIG. 2A indicate a multi-line bus that has address lines, data lines and control lines. The lighter arrows indicate control signal lines. The arrows between the states 3 and n are meant to illustrate that there could be any number of floor plan blocks connected by an associated number of DB bus stages.

As indicated previously, two blocks of particular significance are the BIST block indicated by the number 131 and the comparator block indicated by the number 132. The BIST block 131 is connected to the beginning of the bus and the Comparator block 132 is connected to the end of the bus.

The block 131 is a conventional BIST controller. Block 132 is a conventional comparator circuit for comparing expected data with data actually read from a memory array. BIST controller 131 issues conventional BIST commands on the BD bus. However, the BIST controller 131 does not control the time at which the comparator 132 actually samples the actual data read from the bus in order to compare it to the expected data. That is, the BIST controller does not control the expected latency of the data read from a memory array. The manner in which the latency is handled is explained below.

Figure 2B:
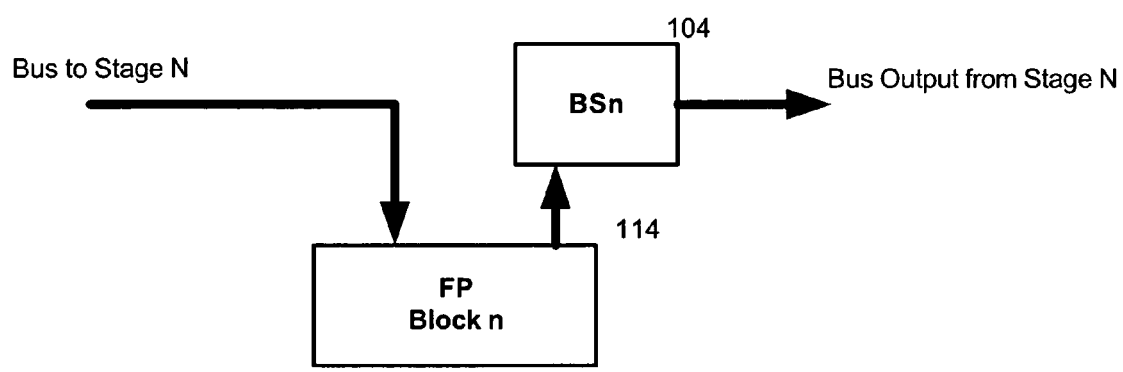
FIGS. 2B and 2C are diagrams showing the possible signal paths.
Figure 2C:
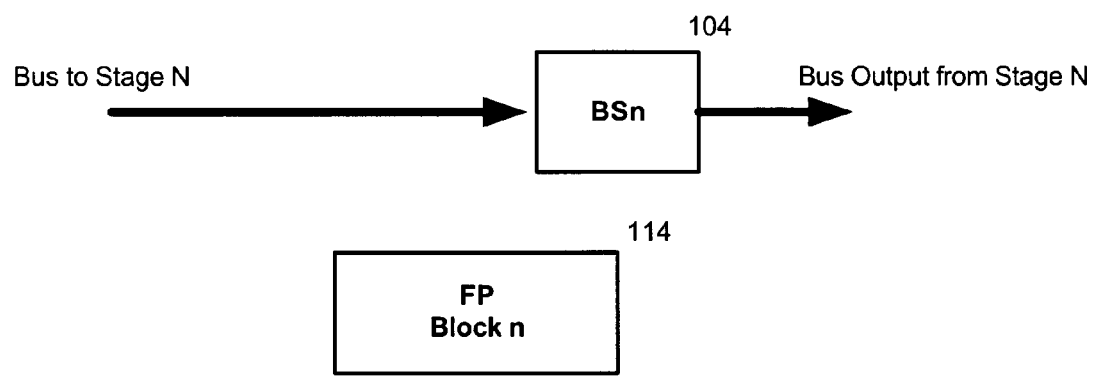

As indicated by the diagrams in FIGS. 2B and 2C, the data on the DB bus can take one of two paths through each stage. As indicated in FIG. 2B, the data on the bus can go to the FP block and then the FP block will provide data to the next stage of the bus. Alternatively as indicated in FIG. 2C, the data on the DB bus can bypass the FP Block and proceed directly to the next stage of the DB bus.

Two bits of control information control the operation of each stage of the DB bus. The logic at each stage of the DB bus responds to these signals as follows:

| Control Signals | Behavior of each DB bus stage |
|---|---|
| 00 | Test signals from BIST engine or other signals pass directly thorough this stage of bus and go to the next stage |
| 10 | Functional data from FP associated FP block past to DB bus and this data goes to the next stage of the DB bus |
| 01 | Signals from the prior stage of the DB bus go the associated FP block rather than to the next stage. BIST data from the DAL in the associated FP block is provided to the next stage of the DQ bus. |

Thus, the two control bits determine if the data on the DB bus follows the path shown in FIG. 2B or if the data follows the path shown in FIG. 2C.

FIG. 3 shows a block diagram of the relevant parts of a FP block such as block 114. Each floor plan block has certain conventional functional logic 302. This functional logic is the main function of each block, but it is not relevant to the present invention. Each floor plan block is provided with a DAL block. DAL is an abbreviation which stands for "Design-for-Test Assist Logic".

In FIG. 3 the DAL logic is designated 304. The parts of floor plan blocks that are primarily relevant to the present invention include one or more memory arrays such as arrays 306 and 308 and DAL logic block 304.

The present invention is directed to testing memory arrays, such as memory arrays 306 and 308, that exist in various floor plan blocks. An integrated circuit chip can include tens, hundreds and even thousands of floor plan blocks that contain memory arrays. With the present invention, the memory arrays on the IC may have a variety of latencies, widths and depths. The BIST issues standard commands to all the floor plan blocks. The DAL in each floor plan block adapts the commands from the BIST to the particular arrays in the associated block.

The DAL logic 304 is connected to the DB bus and it receives input signals from the associated stage on the DB bus as shown in FIG. 2A. It also can provide data and control signal to the associated stage of DB bus logic. A block diagram of the relevant parts of a representative DAL logic block 114 is shown in FIG. 4.

As illustrated in FIG. 3, each DAL block has a input bus connected to the DB bus and an output bus connected to the DB Bus. The DAL logic also provides a control signal to the DB bus gating logic. The DAL block provides data to and it receives data from the RA arrays. The DAL blocks contain registers that contain values that are used to stage the control signals such that the data read from an associated array is aligned with the control signals thereby providing the appropriate latency for the array. The control signals for the RAs are not shown since they are conventional.

Each memory array on the integrated chip 100 is assigned an ID (termed an RA address). As illustrated in FIG. 4, each DAL block has logic to detect the RA address of the associated memory arrays when such an address appears on the DB bus. When the RA address of a block appears on the DB bus, along with he appropriate control signals, a test of the associated RAs is initiated as will be described.

Figure 4:
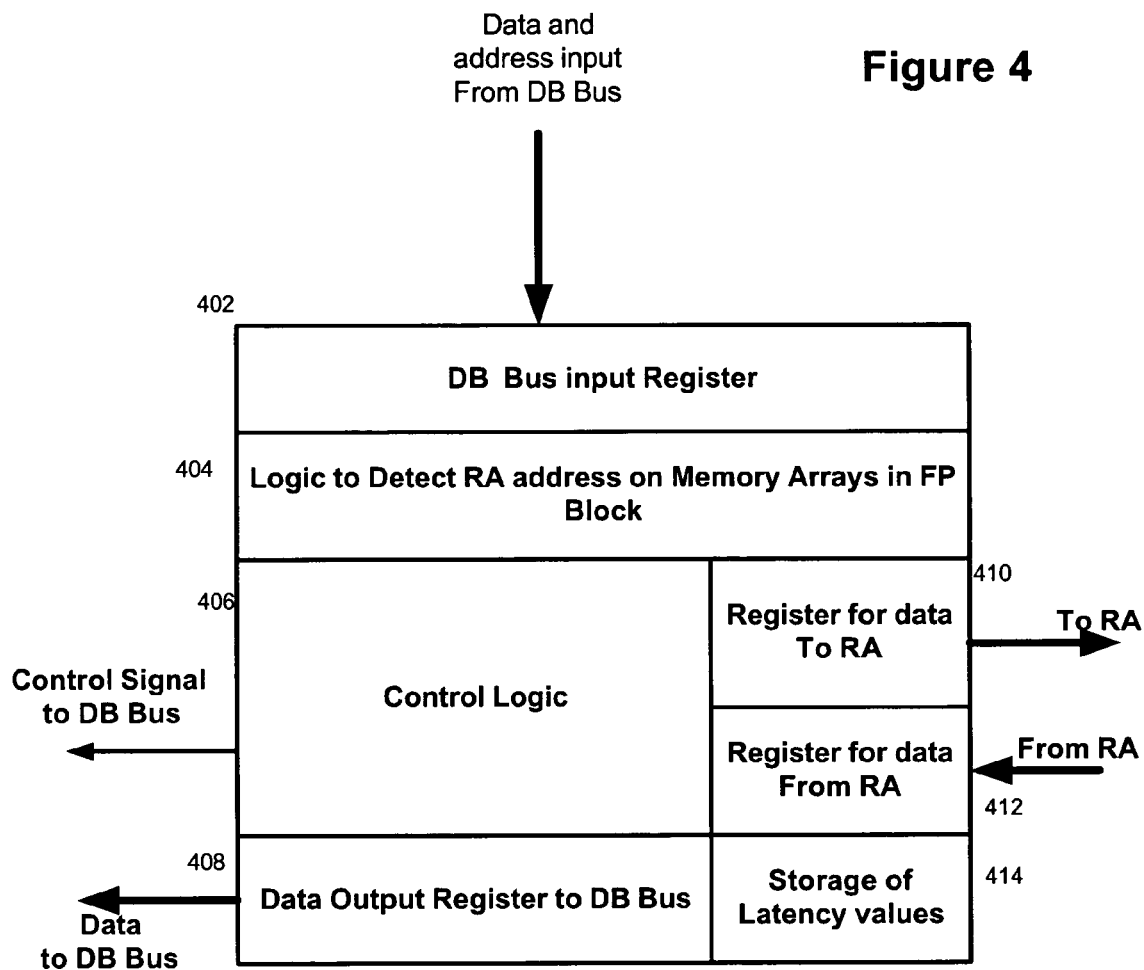
FIG. 4 is a block diagram of a DAL.

As illustrated in FIG. 4, each DAL block has a register 402 to receive data from the DB bus, logic 404 to detect the associated RA addresses, a Data output register for data going to the DB bus, registers 410 and 412 to send and receive data from the associated RAs, registers which store values used to ensure that the control information sent to the comparator is aligned with the data read from the associated RAs. The operation of the DAL blocks will be described later with respect to FIG. 6.

Figure 5:
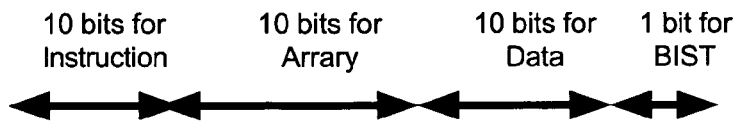
FIG. 5 shows the configuration of the bus.

As shown in FIG. 5, the DB bus includes lines to transmit an instruction, an array address, data and a BIST control bit. The exact number of lines for each section of the bus is a matter of engineering design considering the number of arrays on the chip, the size of the arrays and various other aspects of the circuitry on the chip.

Figure 6:
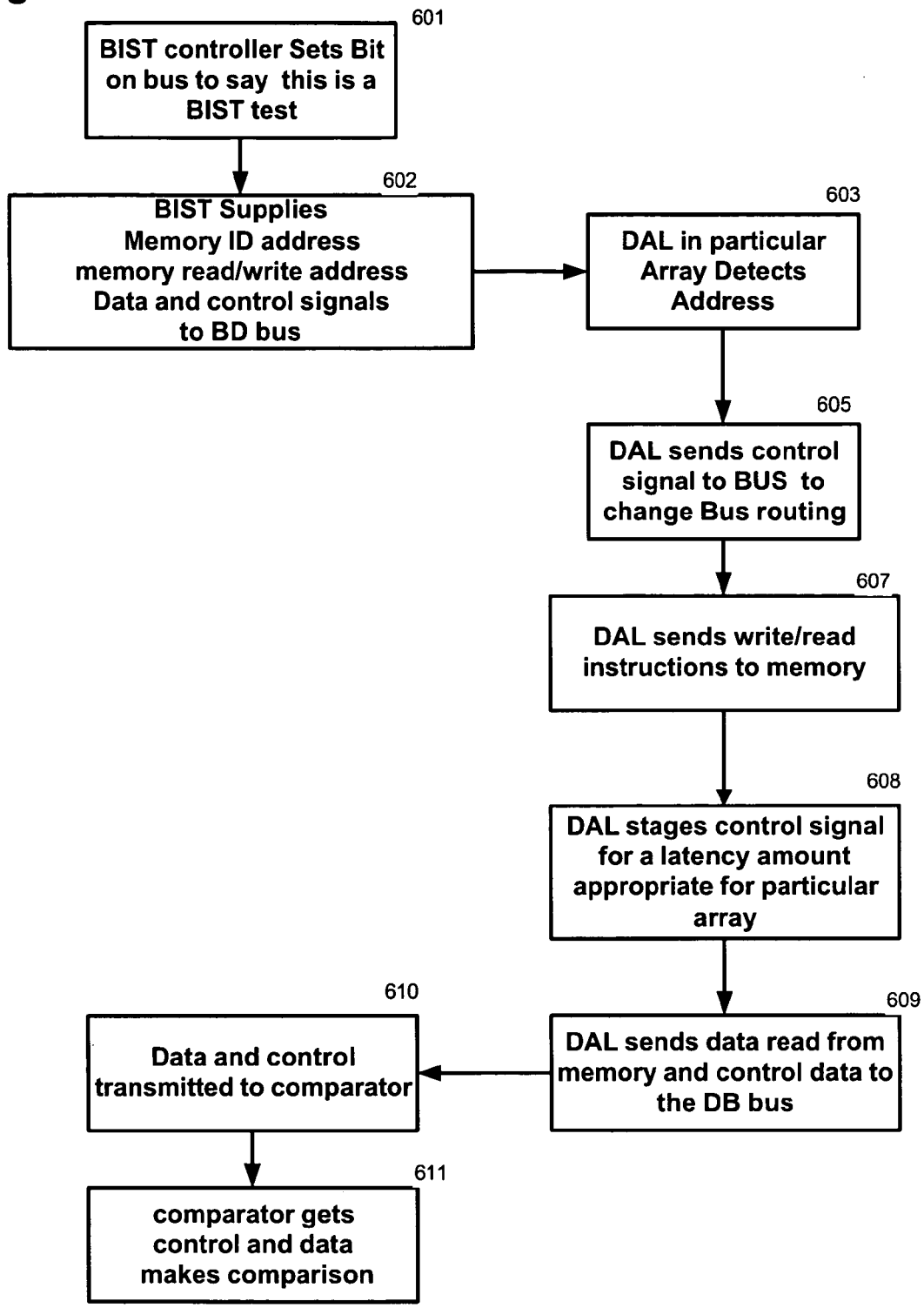
FIG. 6 is a flow diagram showing the operation of the system.

The system operates as shown by the flow diagram in FIG. 6. A test begins when the BIST controller sets the BIST bit on the DB bus as indicated by block 601. Next, as indicated by block 602, the BIST supplies the memory ID address of a particular array that is to be tested, a memory read/write address, data and control signals to the DB bus. These are normal BIST commands to test a memory array. As indicated by block 603, the memory ID address provided by the BIST is detected by the DAL in the block that includes the array to be tested. When a memory ID is detected by a particular DAL, the command from the BIST is received and decoded by that particular DAL.

When a DAL detects its associated memory ID address, the DAL sends a signal to the control logic in its stage of the DB bus to change the configuration from that shown in FIG. 2C to that shown in FIG. 2B. This is indicated by block 605.

Next as indicated by block 607 the DAL sends appropriate write/read instructions to the memory array indicated by the memory ID address received from the BIST. The write and read commands issued by each DAL take into account the particular characteristics (such as latency, width and depth) of the associated memory array. One DAL may be associated with one or more memory arrays depending upon the floor plan of each particular IC.

As indicated by block 608, the DAL stages the transmission of control signals and data to the DB bus using a latency value appropriate for the array being tested. The data and control signals are transmitted to the DB bus as indicated by block 609. Due to the staging of the control signals using an appropriate value of latency, the data read from the memory array is aligned with the expected data when they both arrive at the comparator. It is noted that since the data and the control signals travel through the same number of stages to the comparator, they remain aligned as they travel to the comparator. This is indicated by block 610.

When the data and the control signals arrive at the comparator, a comparison is performed and if the data read matches the anticipated values the array is operating satisfactorily.

The BIST controller continues sending test data as appropriate. The BIST controller performs the kinds of tests that are conventional for memory arrays.

When the test is compete, the BIST test bit on the DB bus in disabled and the bus returns to the configuration shown in FIG. 2C. The test of another array can then proceed.

It should be understood that the term memory array as used herein means both he actual memory cells and the associated logic. When a test is performed on a memory array, the logic associated with the memory cells is also tested.

With the present invention memory arrays having a variety of latencies, widths and depths can be tested using a single BIST controller. The BIST controller issues general or standard commands and the DALs in the various circuit blocks adapt the general or standard test commands from the BIST into commands appropriate for the particular characteristics of the memory arrays in the associated blocks.

It is noted that in the embodiment shown herein the BIST controller, the DALs and the comparator are connected by a debug bus. It should be understood that in other embodiments of the invention, the bus connecting these units could be a different type of serial bus. For example, the bus could be a bus dedicated for BIST purposes or it could be a bus used, at some times, for some other purpose.

In the embodiment shown herein, the data and control signals are staged and transmitted together. The latency of the memory is handled by the DAL and it delays transmission of the control signals so that the data and control signals are transmitted to the comparator together. All the signals are then delayed the same number of cycles as they go from one memory to another along the bus and they arrive at the bus at a coordinated time.

In an alternate embodiment, the DAL actually sends a latency value to the comparator. This latency value is then used to insure that the data signals are sampled at the correct time.

In the embodiment shown herein, there is only one BIST controller and one comparator. In an alternate embodiment, a single IC has a number of BIST controllers. Each BIST controller has a separate bus connected to a plurality of floor plan blocks and to a comparator Each floor plan block having a DAL. In such an embodiment, each BIST controller and its associated DALs operate as does the system described above.

While the invention has been shown and described with respect to various specific embodiments of the invention, it should be understood that various changes in form and detail can be made without departing form the spirit and scope of the invention. The scope of the invention is limited only by the appended claims.

We claim:

1. A system for testing memory arrays in circuit blocks on an integrated circuit, each of said memory arrays having an array address, said system including:
   a serial bus having a series of stages, one stage being associated with each of said circuit blocks,
   design for test assist logic (DAL) associated with each of said circuit blocks, said DAL being connected to the associated stage of said serial bus, and being associated with the memory arrays in the circuit block with which said DAL is associated,
   a BIST controller connected to a first stage of said serial bus, said BIST controller issuing array addresses and associated test commands on said serial bus,
   a comparator connected to the final stage of said serial bus, and
   control circuitry in each DAL, said control circuitry being adapted: to recognize the array address of the associated memory arrays, to execute test commands associated with the recognized address to test the associated arrays, the data resulting from said tests being gated to said serial bus together with commands for transmission to said comparator,
   said comparator adapted to compare said data from said arrays, to expected values of said data to determine if said arrays are operating satisfactorily.

2. The system recited in claim 1 wherein each stage of said bus, includes logic for directing signals on said bus to either to the next stage of said bus or to the DAL associated with said stage of the bus.

3. The system recited in claim 2 wherein said DAL includes logic to generate a signal when said DAL recognized the address of an associate array to direct the associated stage of said bus to direct signals of said bus to said DAL and not to the next stage of said bus.

4. The system recited in claim 1 wherein a DAL is associated with a plurality of memory arrays in a circuit block.

5. The system recited in claim 1 wherein said memory arrays have a number of different latencies, widths, and depths.

6. The system recited in claim 1 wherein each floor plan block also includes functional logic.

7. The system recited in claim 1 wherein said bus is a debug bus.

8. The system recited in claim 1 wherein each DAL stages the transmission of data and control signals to said bus in accordance with the latency of the associated memory array.

9. The system recited in claim 1 were each DAL sends write/read commands to the associated memory array.

10. The system recited in claim 1 wherein each DAL, sends commands to the associated stage of said bus, the change the configuration of said bus, sends write/read commands to the associated memory array, and transmits data from said memory array and control signals to said bus in a coordinated manner that takes into account the latency of the associated memory array.

11. A method of testing memory arrays in circuit blocks on an integrated circuit, each of said memory arrays having an array address, said circuit blocks being connected by a serial bus, said integrated circuit including a BIST controller connected to a beginning stage of said serial bus and a comparator connected to an end stage of said serial bus, said method including the steps of:
applying commands from said BIST controller to said serial bus, said commands including the address of a particular array and associated test commands,
at a circuit block including a particular array, recognizing the array address of the particular array and applying the associated command to the particular array, thereby producing test data,
transferring, via said bus, said test data and control signals to said comparator via said serial bus for comparison of said test data to expected values.

12. The method recited in claim 11 wherein each stage of said bus, includes logic for directing signals on said bus to either to the next stage of said bus or to the DAL associated with said stage of the bus.

13. The method recited in claim 12 including the step of said DAL generating a signal when said DAL recognized the address of an associate array to direct the associated stage of said bus to direct signals of said bus to said DAL and not to the next stage of said bus.

14. The method recited in claim 11 wherein a DAL is associated with a plurality of memory arrays in a circuit block.

15. The method recited in claim 11 wherein said memory arrays have a number of different latencies, widths, and depths.

16. The method recited in claim 11 wherein each floor plan block also includes functional logic.

17. The method recited in claim 11 wherein said bus is a debug bus.

18. The method recited in claim 11 wherein each DAL stages the transmission of data and control signals to said bus in accordance with the latency of the associated memory array.

19. The method recited in claim 11 were each DAL sends write/read commands to the associated memory array.

20. The method recited in claim 11 wherein each DAL, sends commands to the associated stage of said bus, the change the configuration of said bus, sends write/read commands to the associated memory array, and transmits data from said memory array and control signals to said bus in a coordinated manner that takes into account the latency of the associated memory array.

21. A system for testing memory arrays in circuit blocks on an integrated circuit, each of said memory arrays having an array address, said system including:
a serial bus having a series of stages, one stage being associated with each of said circuit blocks,
a BIST controller connected to a first stage of said serial bus, said BIST controller issuing array addresses and associated test commands on said serial bus,
a comparator connected to the final stage of said serial bus for comparing data read from memory arrays to expected data,
design-for-test assist logic (DAL) associated with each of said circuit blocks, said DAL being connected to the associated stage of said serial bus, and being adapted to recognize the array address of the associated memory arrays and to control writing and reading data from the associated memory array in a manner consistent with the command from the BIST and consistent with the characteristics of the associated memory array,
whereby one BIST controller and one comparator can be used to test a plurality of memory arrays having different characteristics.

* * * * *